United States Patent
Fuse et al.

(10) Patent No.: US 7,432,207 B2
(45) Date of Patent: Oct. 7, 2008

(54) METHOD FOR ETCHING OBJECT TO BE PROCESSED

(75) Inventors: Takashi Fuse, Nirasaki (JP); Kiwamu Fujimoto, Nirasaki (JP); Tomoyo Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 10/486,363

(22) PCT Filed: Jun. 10, 2002

(86) PCT No.: PCT/JP02/05748

§ 371 (c)(1),
(2), (4) Date: Mar. 1, 2004

(87) PCT Pub. No.: WO03/021652

PCT Pub. Date: Mar. 13, 2003

(65) Prior Publication Data

US 2004/0206725 A1    Oct. 21, 2004

(30) Foreign Application Priority Data

Aug. 31, 2001 (JP) ............................. 2001-264500
Aug. 31, 2001 (JP) ............................. 2001-264501

(51) Int. Cl.
*H01L 21/302* (2006.01)
(52) U.S. Cl. .................. 438/706; 438/714; 438/723
(58) Field of Classification Search ................ 438/706, 438/714, 724, 723, 725, 710, 712
See application file for complete search history.

(56) References Cited

U.S. PATENT DOCUMENTS

| | | | | |
|---|---|---|---|---|
| 5,741,396 A | * | 4/1998 | Loewenstein | 438/724 |
| 5,786,276 A | * | 7/1998 | Brooks et al. | 438/724 |
| 5,958,793 A | * | 9/1999 | Patel et al. | 438/689 |
| 6,103,590 A | * | 8/2000 | Swanson et al. | 438/409 |
| 6,232,184 B1 | * | 5/2001 | Wang et al. | 438/265 |
| 6,251,770 B1 | * | 6/2001 | Uglow et al. | 438/624 |
| 6,284,657 B1 | * | 9/2001 | Chooi et al. | 438/687 |
| 6,329,290 B1 | * | 12/2001 | Zhao | 438/700 |
| 6,337,277 B1 | * | 1/2002 | Chou et al. | 438/689 |
| 6,448,177 B1 | * | 9/2002 | Morrow et al. | 438/638 |
| 6,617,244 B2 | * | 9/2003 | Nishizawa | 438/637 |
| 6,635,185 B2 | * | 10/2003 | Demmin et al. | 216/64 |
| 6,670,278 B2 | * | 12/2003 | Li et al. | 438/710 |
| 6,764,958 B1 | * | 7/2004 | Nemani et al. | 438/758 |

FOREIGN PATENT DOCUMENTS

| | | |
|---|---|---|
| JP | 8-55835 | 2/1996 |
| JP | 2001-68455 | 3/2001 |
| JP | 2002-110644 | 4/2002 |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

An object to be processed has a structure having an SiC film and an organic Si-low dielectric constant film formed on the SiC film. The SiC film is etched using a plasma produced from an etching gas and using the organic Si low-dielectric constant film as a mask. The etching gas contains $CH_2F_2$ or $CH_3F$.

5 Claims, 6 Drawing Sheets

METHOD FOR ETCHING OBJECT TO BE PROCESSED

FIELD OF THE INVENTION

The present invention relates to a method for etching an object to be processed including an SiC or an SiN portion; and, more particularly, to a method for etching the SiC or the SiN portion of the object to be processed in a processing chamber by using a plasma of an etching gas, wherein the object may be, e.g., a semiconductor wafer having an SiC or an SiN film serving as a barrier layer and an interlayer insulating film formed thereon.

BACKGROUND OF THE INVENTION

In a wiring process of a semiconductor device, an interlayer insulating film formed between wiring layers is etched so that the wiring layers can be electrically connected with each other. In such a case, formed beneath the interlayer insulating film is an SiC or an SiN film serving as a barrier layer. When the SiC or the SiN film is etched to form a wiring pattern following an etching of the interlayer insulating film, the interlayer insulating film is used as a mask.

Meanwhile, since further improvement in speed is required in the semiconductor device, a material having a low dielectric constant is used for the interlayer insulating film, in which case an organic Si-based material has been known as the material having the low dielectric constant.

As a method for etching the SiC film, there are disclosed a technique of using $CF_4$ and $O_2$ in Japanese Patent Laid-open Publication No. 1982-124438; a technique of using $CF_4$, $CHF_3$ and $O_2$ in Japanese Patent Laid-open Publication No. 1987-216335; and a technique of using $CHF_3$ and Ar in Japanese Patent Laid-open Publication No. 1992-293234. However, none of the techniques yield a satisfactory result due to providing a low etching rate of approximately 10 nm/min. In addition to the low etching rate when etching the SiC film by using an organic Si-based low dielectric constant film formed thereon as a mask, the techniques fail to provide a sufficiently satisfactory etching selectivity with respect to the organic Si-based low dielectric constant film.

Similarly in etching an SiN film, an etching technique capable of maintaining a sufficiently satisfactory etching rate with high etching selectivity with respect to the organic Si-based low dielectric constant film has not been found.

SUMMARY OF THE INVENTION

It is, therefore, a primary object of the present invention to provide an etching method capable of etching a SiC portion of an object to be processed with a sufficient etching rate.

It is another object of the present invention to provide an etching method capable of increasing the etching rate and an etching selectivity with respect to an organic Si-based low dielectric constant film, in case of etching the SiC portion by employing the organic Si-based low dielectric constant film as a mask.

It is a further object of the present invention to provide an etching method capable of increasing the etching rate and the etching selectivity with respect to the organic Si-based low dielectric constant film, in case of etching an SiN portion by employing the organic Si-based low dielectric constant film as a mask.

In accordance with a preferred embodiment of the present, there is provided a method for etching an object to be processed, comprising the steps of:

receiving the object including an SiC portion in a processing chamber;

supplying an etching gas into the processing chamber, while converting the etching gas into a plasma; and etching the SiC portion by the plasma of the etching gas, wherein the etching gas supplied into the processing chamber includes $CH_2F_2$.

In accordance with another preferred embodiment of the present invention, there is provided a method for etching an object to be processed, comprising the steps of:

receiving the object including an SiC portion in a processing chamber;

supplying an etching gas into the processing chamber, while converting the etching gas into a plasma; and etching the SiC portion by the plasma of the etching gas, wherein the etching gas supplied into the processing chamber includes $CH_3F$.

In accordance with still another preferred embodiment of the present embodiment of the present invention, there is provided a method for etching an object to be processed, comprising the steps of:

receiving the object including an SiN portion in a processing chamber;

supplying an etching gas into the processing chamber, while converting the etching gas into a plasma; and etching the SiN portion by the plasma of the etching gas, wherein the etching gas supplied into the processing chamber includes $CH_2F_2$ and $O_2$.

DETAILED DESCRIPTION OF THE PREFERRED EMBODIMENTS

The preferred embodiments of the present invention will be described in detail with reference to the accompanying drawings.

Figure 1:
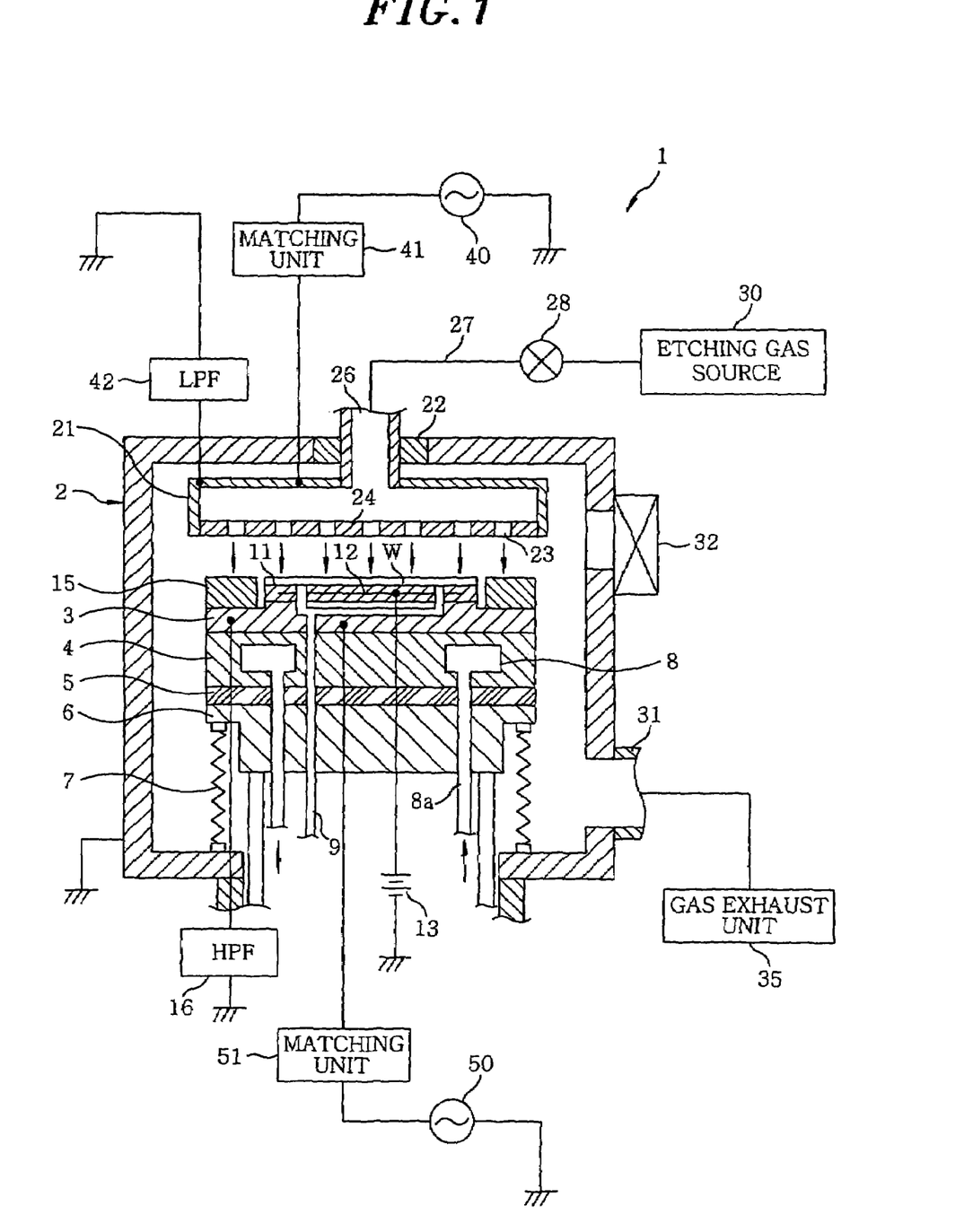
FIG. 1 provides a schematic cross sectional view showing an exemplary dry-etching apparatus for carrying out an etching method in accordance with the present invention.

FIG. 1 is a schematic cross sectional view of a dry-etching apparatus for executing an etching method in accordance with a preferred embodiment of the present invention.

An etching apparatus 1 is a capacitively coupled parallel plate type etching apparatus having an upper and a lower electrode plates facing each other in parallel, wherein a high frequency power supply for generating a plasma is connected with one of the plates.

The etching apparatus 1 includes a chamber 2 of a cylindrical shape having a surface made of, e.g., aluminum treated with a thermal spray coating of ceramic, wherein the chamber 2 is frame-grounded. A susceptor 3 serving as a lower electrode is supported in the chamber 2 by a supporting member 4, for horizontally mounting thereon a semiconductor wafer (hereinafter referred to as a wafer) W made of, e.g., silicon, having a specified number of films. The supporting member 4 is supported by a support 6 of an elevating mechanism (not shown) via an insulating plate 5 made of, e.g., ceramic, and the susceptor 3 can be raised and lowered by the elevating mechanism. An atmospheric center region under the support 6 is hermetically covered with a bellows 7 so that the ambient in the chamber 2 is hermetically separated from the outer atmosphere.

Provided within the supporting member 4 is a coolant passageway 8 through which a coolant introduced from a coolant introducing line 8a is circulated to generate a cold heat. The generated cold heat is thermally conducted to the wafer via the susceptor 3, such that the temperature of a surface of the wafer W can be adjusted to a desired temperature. Further, there is installed a gas supply line 9, for supplying the back surface of the wafer W with a thermally conductive medium, e.g., He gas, by which the cold heat in the susceptor 3 is transmitted to the wafer W, to thereby maintain the temperature of the wafer W at a specified temperature.

The susceptor 3 has a disc-shaped protrusion in an upper center portion thereof, on top of which there is provided an electrostatic chuck 11 made up of an insulating material and having an electrode 12 embedded therein, for electrostatically adsorbing the wafer W by a DC voltage applied from a DC power supply 13 connected with the electrode 12. Further, on an upper peripheral portion of the susceptor 3, there is provided an annular focus ring 15 to surround the wafer mounted on the electrostatic chuck 11, and to thereby improve etching uniformity.

Installed above the susceptor 3 is a shower head 21 serving as an upper electrode and facing the susceptor 3 in parallel. The shower head 21 is supported at an upper part of the chamber 2 via an insulating member 22 and has a plurality of gas inlet holes 23 at a surface 24 facing the susceptor 3. Further, the distance between the susceptor 3 and the shower head 21 can be adjusted by using the elevating mechanism.

Provided at a center portion of the shower head 21 is a gas inlet opening 26 connected to a gas supply line 27, which is connected to an etching gas source 30 via a valve 28. From the etching gas source 30, a predetermined etching gas, e.g., $CH_3F$, $CH_2F_2$, $CF_4$, $O_2$ or Ar, is supplied.

Installed at a lower part of a sidewall of the chamber 2 is a gas exhaust line 31, which is connected to a gas exhaust unit 35. The gas exhaust unit 35 contains a vacuum pump such as a turbo molecular pump therein, by which the chamber 2 is evacuated to a predetermined pressure. Further, a gate valve 32 is installed on the sidewall of the chamber 2, through which the wafer W is conveyed between the chamber 2 and a neighboring load-lock chamber (not shown), while the gate valve 32 is open.

The shower head 21 serving as the upper electrode is connected to a high frequency power supply 40 via a matching unit 41. The high frequency power supply 40 supplies a high frequency of, e.g., 60 MHz. In addition, the shower head 21 is further connected to a low pass filter (LPF) 42.

The susceptor 3 serving as the lower electrode is connected to a high frequency power supply 50 via a matching unit 51. The high frequency power source 50 supplies a high frequency of, e.g., 2 MHz. Additionally, the susceptor 3 is further connected to a high pass filter (HPF) 16.

Figure 2A:
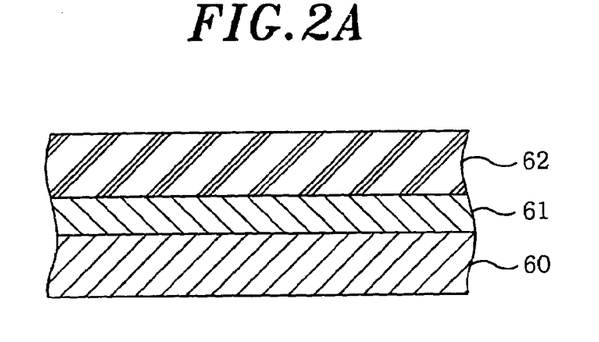
FIG. 2 illustrates a sectional view of a structure having an SiC film on a wiring layer and an organic Si-based low dielectric constant film formed on the SiC film, wherein an etching of the SiC film is performed following an etching of the organic Si-based low dielectric constant film.
Figure 2B:
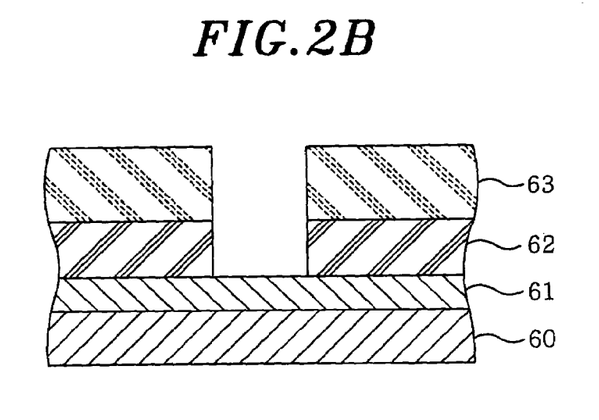

Hereinafter, a method for etching an SiC film by using the above-described etching apparatus will be described in detail. In a structure having a wiring layer 60 made of, e.g., Cu; an SiC film 61 serving as a barrier layer formed thereon; and an interlayer insulating film 62 made of an organic Si-based low dielectric constant film, formed on the SiC film 61, as shown in FIG. 2A, the interlayer insulating film 62 is etched by using a resist layer 63 as a mask, to form a structure as illustrated in FIG. 2B, after which the SiC film 61 is etched by using the interlayer insulating film 62 as a mask.

The organic Si-based low dielectric constant film can be made of, e.g., polyorganosiloxane, represented by the following chemical formula:

In the above chemical formula, R denotes an alkyl group such as methyl group, ethyl group and propyl group or derivatives thereof; or an allyl group such as phenyl group or derivatives thereof.

In executing such etching process, first with the gate valve 38 open, the wafer W having the wiring layer 60, the SiC film 61 and the interlayer insulating film 62 is carried into the chamber 2, and mounted on the susceptor 3, wherein the interlayer insulating film 62 is made of the organic Si-based low dielectric constant film etched according to a predetermined pattern and formed on the SiC film 61. Then, the DC voltage is applied to the wafer W by the DC power supply 13 and, as a result, the wafer W is electrostatically adsorbed by the electrostatic chuck 11. Thereafter, the gate valve 32 is closed, and the chamber 2 is evacuated to a predetermined vacuum level by operating the gas exhaust unit 35.

Figure 2C:
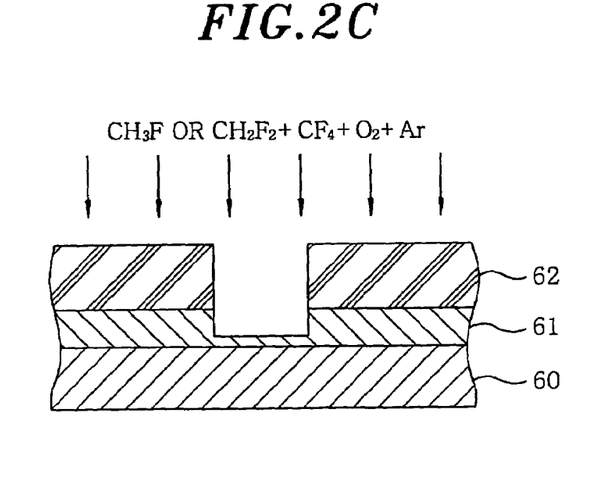
Figure 3A:
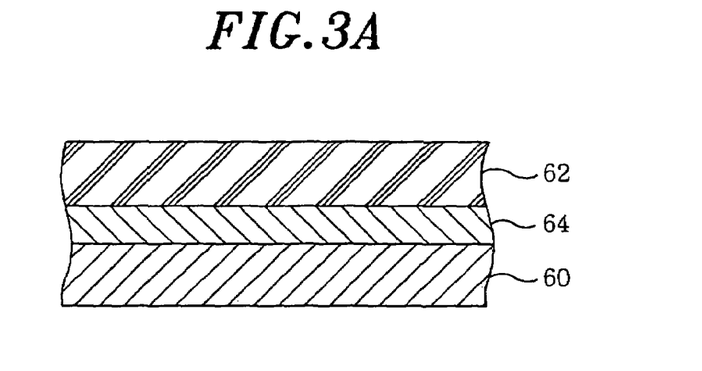
FIG. 3 offers a sectional view of a structure having an SiN film on a wiring layer and an organic Si-based low dielectric constant film formed on the SiN film, wherein an etching of an SiN film is performed following an etching of an organic Si-based low dielectric constant film.
Figure 3B:
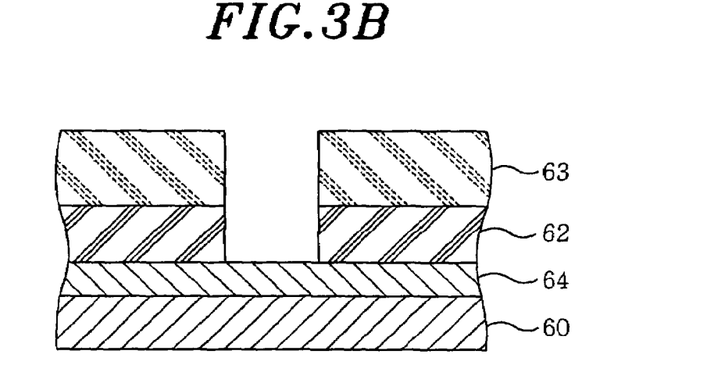
Figure 3C:
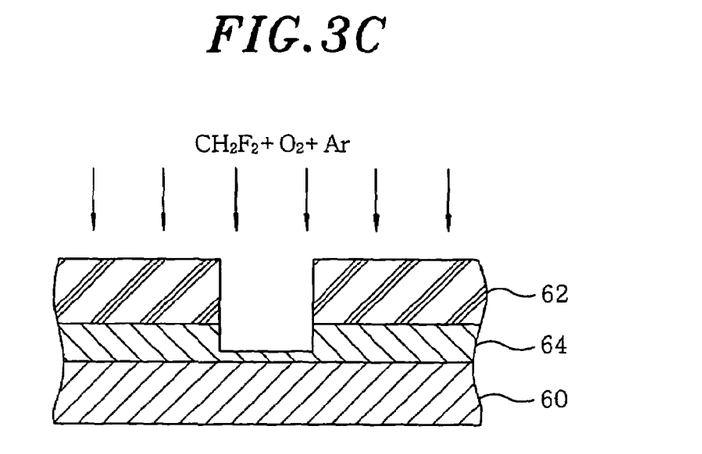

Under the existing state, a predetermined etching gas is supplied into the chamber 2 from the etching gas source 30. Next, a high frequency power of a predetermined frequency is applied to the shower head 21 by the high frequency power supply 40 to generate a high frequency electric field between the shower head 21 serving as the upper electrode and the susceptor 3 serving as the lower electrode, and thereby forming a plasma by the etching gas. As shown in FIG. 2C, the etching process of the SiC film 61 is performed by making the plasma act on the SiC film 61, at which time a predetermined high frequency is applied from the high frequency power supply 50 to the susceptor 3 to induce the ions in the plasma to be attracted toward the susceptor 3.

Hereinafter, etching results of the SiC film using the organic Si-based low dielectric constant film as a mask and containing polymethylsiloxane as a main component thereof will be described in detail. The etching apparatus shown in FIG. 1 was used and the following conditions were applied: an ambient pressure of the chamber of 6.65 Pa; a high frequency power of 60 MHz applied to the shower head for generating a plasma; a high frequency power of 2 MHz applied to the susceptor for attracting the ions; and a distance of 35 mm between the susceptor and the shower head, while varying the mixture/flow rate of the etching gas and high frequency power, as given in Table 1.

TABLE 1

| No. | Flow Rate (×10⁻³ L/min) | | | | | Power (W) | | Etching Rate (nm/min) | |
|---|---|---|---|---|---|---|---|---|---|
| | $CH_2F_2$ | $CH_3F$ | $O_2$ | Ar | $CF_4$ | Upper | Lower | Center | Edge |
| 1 | 10 | 0 | 10 | 100 | 0 | 1500 | 100 | 24.1 | 21.8 |
| 2 | 0 | 10 | 10 | 100 | 0 | 1500 | 100 | 20.8 | 25.0 |
| 3 | 0 | 20 | 10 | 100 | 0 | 1500 | 100 | 47.8 | 43.7 |
| 4 | 0 | 30 | 10 | 100 | 0 | 1500 | 100 | 52.0 | 58.7 |
| 5 | 0 | 20 | 10 | 0 | 0 | 1500 | 100 | 54.2 | 54.2 |
| 6 | 0 | 20 | 10 | 200 | 0 | 1500 | 100 | 43.4 | 45.6 |
| 7 | 0 | 20 | 10 | 100 | 0 | 1500 | 300 | 84.8 | 89.0 |
| 8 | 0 | 30 | 10 | 100 | 0 | 1500 | 300 | 95.7 | 112.3 |
| 9 | 0 | 20 | 10 | 100 | 0 | 1500 | 100 | 85.3 | 83.2 |
| 10 | 10 | 0 | 10 | 100 | 5 | 1500 | 100 | 93.8 | 83.3 |
| 11 | 0 | 10 | 10 | 100 | 5 | 1500 | 100 | 72.8 | 64.5 |

As shown in Table 1, when a gaseous mixture including $CH_2$ or $CH_3F$ was employed as an etching gas, the etching rate greater than 20 nm/min was observed. And the etching selectivity with respect to the organic Si-based low dielectric constant film was 10 and more in a shoulder (peripheral) portion thereof.

Figure 5:
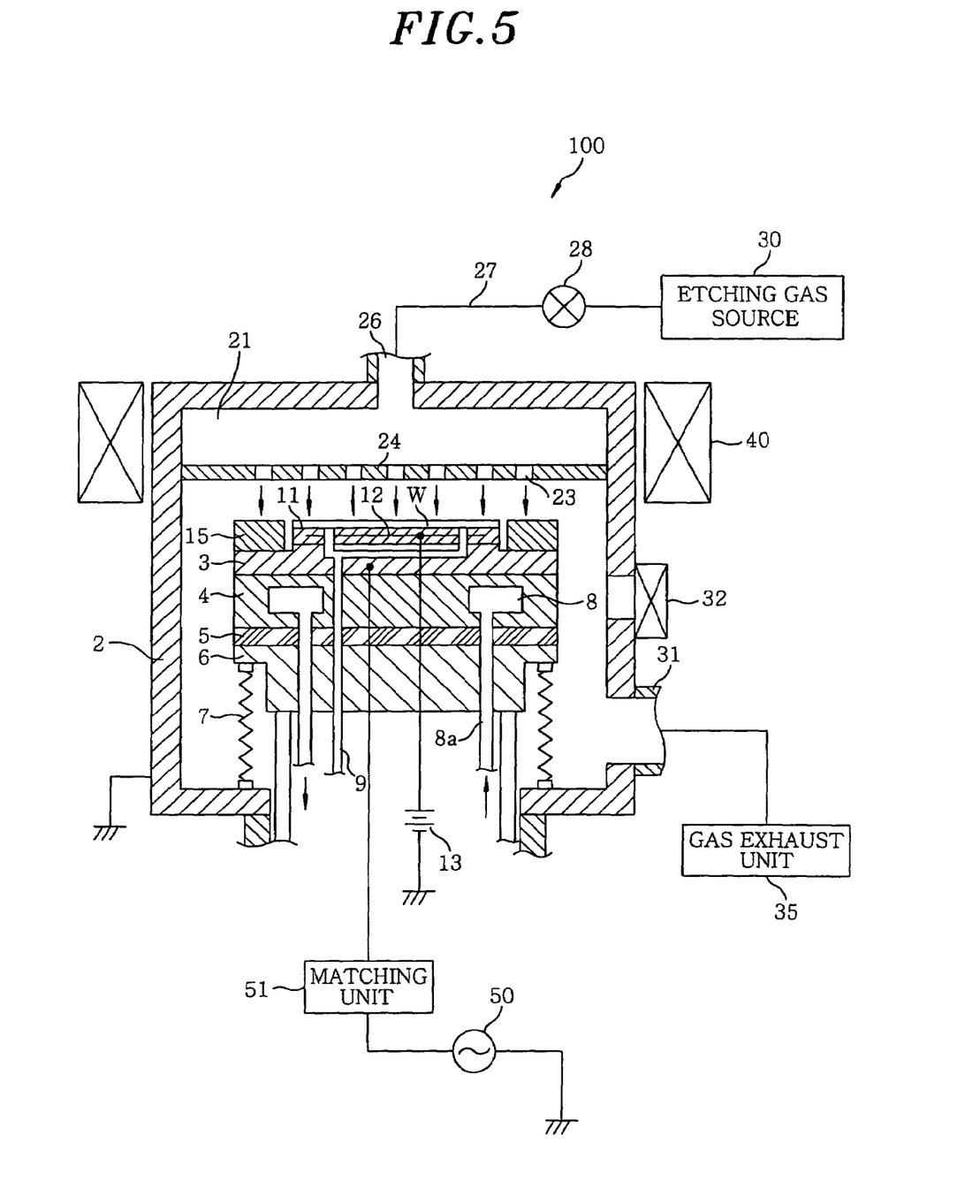
FIG. 5 shows a schematic sectional view of a magnetron plasma etching apparatus for executing the etching method in accordance with the present invention.

Moreover, an etching apparatus, such a magnetron plasma etching apparatus 100, which forms a magnetic field, as illustrated in FIG. 5, was used to perform an etching of the SiC film, under the following conditions: an ambient pressure of the chamber of 9.98 Pa; a high frequency power of 13.56 MHz applied to the susceptor; an etching gas of gaseous mixture of $CH_3F$ and $O_2$, as in No. 5 of Table 1; and a distance of 27 mm between the susceptor and the shower head, while varying the flow rate of the etching gas and the high frequency power as given in Table 2.

TABLE 2

| No. | Flow Rate (×10⁻³ L/min) | | Power (W) | Etching Rate (nm/min) | Selectivity |
|---|---|---|---|---|---|
| | $CH_3F$ | $O_2$ | | | |
| 12 | 20 | 30 | 200 | 130 ± 12% | 13.5 |
| 13 | 20 | 30 | 300 | 141 ± 12% | 13.3 |
| 14 | 30 | 30 | 300 | 181 ± 12% | 11.0 |
| 15 | 30 | 60 | 300 | 165 ± 12% | 10.7 |

As shown in Table 2, the etching rate of 130 nm/min and more and the etching selectivity of 10.7 and more were obtained.

Hereinafter, the magnetron plasma etching apparatus 100 will be described in detail.

The magnetron plasma etching apparatus 100 shown in FIG. 5 includes a chamber 2 of a cylindrical shape having a surface made of, e.g., aluminum treated with a thermal spray coating of ceramic, wherein the chamber 2 is grounded. A susceptor 3, which serves as a lower electrode is supported in the chamber 2 by a supporting member 4, for horizontally mounting thereon a semiconductor wafer W made of, e.g., silicon, having a specified number of films. The supporting member 4 is supported by a support 6 of an elevating mechanism (not shown) via an insulating plate 5 made of, e.g., ceramic, and the susceptor 3 can be raised and lowered by the elevating mechanism. An atmospheric center region below the support 6 is hermetically covered with a bellows 7 so that the ambient in the chamber 2 is hermetically separated from the outer atmosphere.

Provided within the supporting member 4 is a coolant passageway 8 through which a coolant introduced from a coolant introducing line 8a is circulated to generate a cold heat. The generated cold heat is thermally conducted to the wafer W via the susceptor 3, such that the temperature of a surface of the wafer W can be adjusted to a specified temperature. Further, there is installed a gas supply line 9, for supplying the back surface of the wafer W with a thermally conductive medium, e.g., He gas, by which the cold heat in the susceptor 3 is transmitted to the wafer, to thereby maintain the temperature of the wafer W at a specified temperature.

The susceptor 3 has a disc-shaped protrusion in an upper center portion thereof, on top of which there is provided an electrostatic chuck 11 made up of an insulating material and having an electrode 12 embedded therein, for electrostatically adsorbing the wafer W by a DC voltage applied from a DC power supply 13 connected with the electrode 12. Further, on an upper peripheral portion of the susceptor 3, there is provided an annular focus ring 15 to surround the wafer mounted on the electrostatic chuck 11, and to thereby improve etching uniformity.

Installed in an upper part of the chamber 2 is a shower head 21. Provided at a lower surface 24 of the shower head 21 are a plurality of gas inlet holes 23. Further, the distance between the susceptor 3 and the shower head 21 can be adjusted by using the elevating mechanism.

Formed at a center portion of the shower head 21 is a gas inlet opening 26 connected to a gas supply line 27, which is connected to an etching gas source 30 via a valve 28. From the etching gas source 30, a predetermined etching gas is supplied, e.g., $CH_3F$, $CH_2F_2$, $CF_4$, $O_2$ or Ar when the SiC film is being etched.

Installed at a lower part of a sidewall of the chamber 2 is a gas exhaust line 31, which is connected to a gas exhaust unit 35. The gas exhaust unit 35 contains a vacuum pump such as a turbo molecular pump therein, by which the chamber 2 is evacuated to a predetermined pressure. Further, a gate valve 32 is installed on the sidewall of the chamber 2, through which the wafer W is conveyed between the chamber 2 and a neighboring load-lock chamber (not shown), while the gate valve 32 is open.

Furthermore, a high frequency power supply 50 is connected to the susceptor 3 via a matching unit 51.

A dipole ring magnet 40 is disposed at an upper peripheral portion of the chamber 2. The dipole ring magnet 40 includes a plurality of anisotropic cylindrical segment magnets which are arranged in a ring-shaped casing made of a magnetic material to be arranged in a ring shape therein. The anisotropic cylindrical segment magnets are disposed in a manner such that the directions of magnetization thereof slightly vary from one another, to ensure an overall uniformity in a horizontal magnetic field.

As shown in FIG. 5, the dipole ring magnet 40 forms the horizontal magnetic field in a space between the susceptor 3 and the shower head 21, and the high frequency power supply 50 forms a vertical electric field, thereby creating an orthogonal electromagnetic field. Such orthogonal electromagnetic field causes a drift motion of electrons, which generates a high energy magnetron discharge. Accordingly, a plasma of a processing gas having a high energy generated thereby enables a highly efficient etching of the film of the wafer W.

There is no restriction in choosing the shape of the anisotropic cylindrical segment magnets constituting the dipole ring magnet 40, and, for instance, a cylindrical shape or a prism shape can be employed therefor. The material for the anisotropic cylindrical segment magnets is not limited to any particular element: various materials, e.g., rare earth-based magnet, ferritic magnet, Alnico magnet or the like can be used therefor.

A method for etching an SiN film by using the etching apparatus illustrated in FIG. 1 will be described in detail. In this case, the structure of the wafer resembles that of FIG. 2, in which the SiC film is replaced with an SiN film.

Referring to FIG. 1, a gaseous mixture of $CH_2F_2$, $O_2$ and Ar was used as an etching gas. By varying the gas pressure in the chamber 2 according to a flow rate of Ar, the etching selectivity of the SiN film with respect to the organic Si-based low dielectric constant film was increased, while maintaining a high etching rate.

Figure 4:
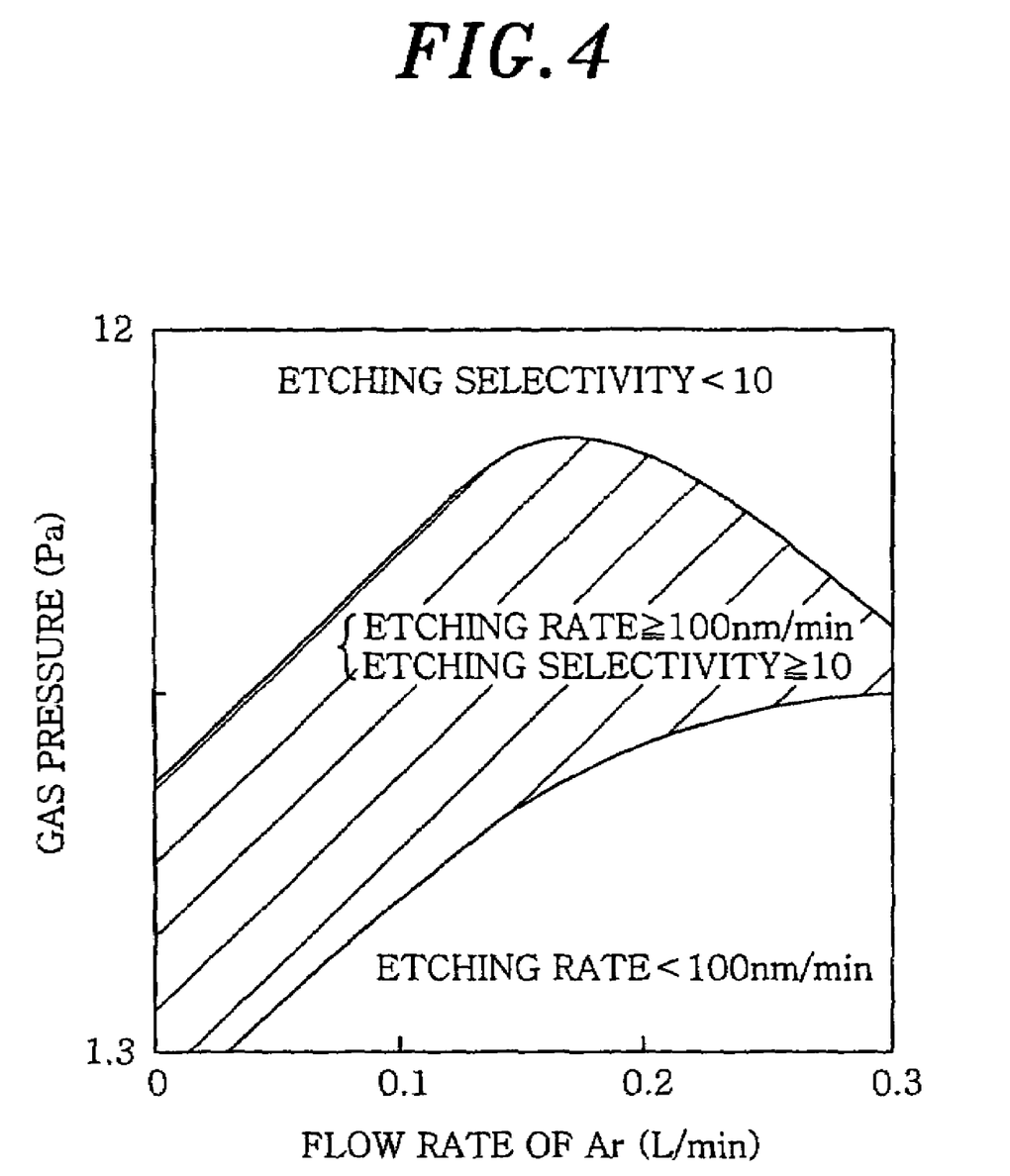
FIG. 4 presents a graph showing relationships between a flow rate of Ar and a gas pressure, and between an etching rate of the SiN film and an etching selectivity of the SiN film with respect to the organic Si-based low dielectric constant film in etching an SiN film.

That is, the relationship as depicted in FIG. 4 can be obtained. FIG. 4 offers an etching result of the SiN film under the following conditions: fixed flow rates of $CH_2F_2$ and $O_2$ at 0.01 L/min and 0.01 L/min, respectively; the flow rate of Ar ranging from 0 to 0.03 L/min which corresponds to the range from 0 to 15 obtained by calculating (the flow rate of Ar)/(sum of the flow rates of $CH_2F_2$ and $O_2$); and a gas pressure varied in a range, preferably from 1.3 to 12.0 Pa. A high frequency power of 1500 W with frequency of 60 MHz was applied to the shower head, while a high frequency power of 100 W with frequency of 2 MHz was applied to the susceptor. In a shaded region shown in FIG. 4, the etching rate of the SiN film was 100 nm/min and more, while the etching selectivity with respect to the organic Si-based low dielectric constant film was 10 and more. That is, when the flow rate of Ar and the gas pressure in the chamber were in a range from 0 to 0.3 L/min and from 1.3 to 12.0 Pa, respectively, there existed a satisfactory gas pressure for each flow rate of Ar. Further, if the flow rate of Ar and the pressure in the chamber were respectively 0.1 L/min and 6.65 Pa, the etching rate was about 232.5 nm/min at the center of the SiN film and about 250.0 nm/min at the edge thereof, and the etching selectivity was 10 and more at the shoulder portion of the organic Si-based low dielectric constant film.

Furthermore, a peak to peak value (Vpp) of the high frequency voltage in the shower head 21 serving as the upper electrode is preferably about 300 V and less. By limiting the Vpp, the etching selectivity with respect to the organic Si-based low dielectric constant film can be enhanced.

Still further, the present invention is not limited to the above-described embodiments and may be tailored to other variations. For example, in the aforementioned embodiments, the SiC film to be etched is arranged below the organic Si-based low dielectric constant film; however, the SiC film may be selectively etched with respect to the organic Si-based low dielectric constant film.

As described above, in accordance with the present invention, a high etching rate can be obtained by etching the SiC film by using the etching gas including $CH_2F_2$ or $CH_3F$. Moreover, by employing the organic Si-based low dielectric constant film as a mask, while using the etching gas including $CH_2F_2$ or $CH_3F$, the SiC film can be etched with the high etching rate and a high etching selectivity with respect to the organic Si-based low dielectric constant film. Furthermore, by using the etching gas including $CH_2F_2$ and $O_2$, in parallel with using the organic Si-based low dielectric constant film as a mask in etching the SiN film, a high etching rate and a high selectivity with respect to the organic Si-based low dielectric constant film can be obtained.

Hereinafter, a method for etching the SiC film by using the magnetron plasma etching apparatus in FIG. 5 will be described in detail. In this case, an $SiO_2$ film was used in lieu of the organic Si-based low dielectric constant film in FIG. 2.

Figure 6:
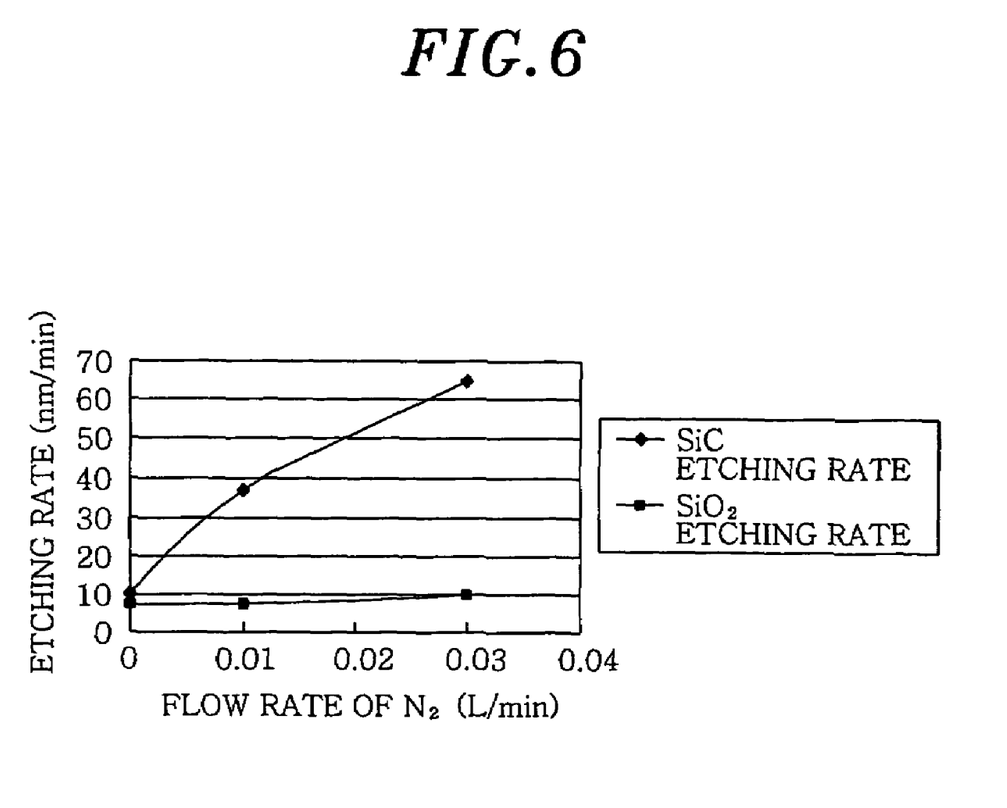
FIG. 6 represents a graph showing a relationship between a flow rate of $N_2$ and $SiC/SiO_2$ film etching rates in case of etching the SiC film by employing an $SiO_2$ film as a mask, wherein the etching gas is a $CH_3F$—$O_2$ based gas with an addition of $N_2$ gas.

Referring to FIG. 5, a gaseous mixture of $CH_3F$, $O_2$ and $N_2$ was used as the etching gas, and the following conditions were applied: a gas pressure in the chamber of 10 Pa; an RF power of 300 W; and flow rates of $CH_3F$, $O_2$ and $N_2$ all conforming to 0.03 L/min. As shown in FIG. 6, a sharp increase in the etching rate of the SiC film was observed with an increase in the flow rate of $N_2$ gas, whereas an etching rate of the $SiO_2$ film hardly increased despite the increase in the flow rate of $N_2$ gas. In other words, it can be concluded that the etching selectivity of the SiC film with respect to the $SiO_2$ film is enhanced with an increase in the flow rate of $N_2$ gas. Further, an SiC film having a thickness of about 100 nm was etched while using the organic Si-based low dielectric constant film as the interlayer insulating film, under the above conditions with an addition of a $N_2$ gas with a flow rate of about 0.01 L/min. In this way, the etching rate of about 77 nm/min and the etching selectivity with respect to the organic Si-based low dielectric constant film of 10 and more were obtained. As a result, it has been found that the etching gas including the $N_2$ gas in addition to the gaseous mixture of $CH_3F$ and $O_2$ allows the SiC film to be etched with a high etching rate and, at the same time, with an increased etching selectivity with respect to the $SiO_2$ film or the organic Si-based low dielectric constant film serving as the interlayer insulating film. Further, etching rates and selectivities may vary depending on which apparatus, i.e., that of FIG. 1 or 5, is used.

While the invention has been shown and described with respect to the preferred embodiments, it will be understood by those skilled in the art that various changes and modifications may be made without departing from the spirit and scope of the invention as defined in the following claims.

What is claimed is:

1. A method for etching an object to be processed, comprising:

receiving the object in a processing chamber, the object including an SiC portion and an organic Si-based low dielectric constant film, prepared on the SiC portion, serving as an insulating film;

etching the organic Si-based low dielectric constant film by using a resist layer as a mask to provide a patterned organic Si-based low dielectric constant film, the resist film being disposed directly on the organic Si-based low dielectric constant film;

supplying an etching gas into the processing chamber while converting the etching gas into a plasma, the etching gas including $CH_2F_2$, $O_2$ and Ar; and etching the SiC portion by the plasma of the etching gas by using the patterned organic Si-based low dielectric constant film as a mask, wherein the ratio of (a flow rate of Ar)/(a sum of flow rates of $CH_2F_2$ and $O_2$) in the etching gas is equal to or less than 15, and the mask employed in etching the SiC portion consists essentially of the patterned organic Si-based low dielectric constant film.

2. A method for etching an object to be processed, comprising:

receiving the object including an SiC portion and an Si-based low dielectric constant film in a processing chamber;

etching the organic Si-based low dielectric constant film by using a resist layer as a mask to provide a patterned organic Si-based low dielectric constant film, the resist film being disposed directly on the organic Si-based low dielectric constant film;

supplying an etching gas into the processing chamber while converting the etching gas into a plasma; and etching the SiC portion by the plasma of the etching gas by using the patterned organic Si-based low dielectric constant film as a mask, wherein the etching gas supplied into the processing chamber includes $CH_3F$, $O_2$ and $N_2$ and the mask employed in etching the SiC portion consists essentially of the patterned organic Si-based low dielectric constant film.

3. The method of claim 2, wherein the ratio of (the sum of the flow rates of $CH_3F$ and $O_2$)/(the flow rate of $N_2$) in the etching gas ranges from 2 to 12.

4. The method of claim 3, wherein the etching gas further includes $CF_4$.

5. The method of claim 4, wherein the etching gas further includes Ar.

* * * * *